US012222382B2

(12) United States Patent
Su et al.

(10) Patent No.: US 12,222,382 B2
(45) Date of Patent: Feb. 11, 2025

(54) NEAR-FIELD TEST METHOD, SYSTEM, READABLE STORAGE MEDIUM AND COMPUTER

(71) Applicant: FRAGRANT MOUNTAIN MICROWAVE CO., LTD., Zhongshan (CN)

(72) Inventors: Dongcai Su, Zhongshan (CN); Junwei Dong, Zhongshan (CN)

(73) Assignee: FRAGRANT MOUNTAIN MICROWAVE CO., LTD., Guangdong Province (CN)

(*) Notice: Subject to any disclaimer, the term of this patent is extended or adjusted under 35 U.S.C. 154(b) by 0 days.

(21) Appl. No.: 17/958,318

(22) Filed: Sep. 30, 2022

(65) Prior Publication Data

US 2023/0096422 A1 Mar. 30, 2023

(30) Foreign Application Priority Data

Sep. 30, 2021 (CN) .......................... 202111161940.5

(51) Int. Cl.
  *G01R 29/08* (2006.01)
(52) U.S. Cl.
  CPC ................................ *G01R 29/0892* (2013.01)
(58) Field of Classification Search
  CPC ............... G01R 29/0892; G01R 29/08; G01R 29/0871; G01R 29/0814; G01R 29/10; H04B 17/102

(Continued)

(56) References Cited

U.S. PATENT DOCUMENTS

2008/0290885 A1* 11/2008 Matsunami ........ G01R 31/2889
  324/762.01
2010/0308824 A1 12/2010 Grady et al.
(Continued)

FOREIGN PATENT DOCUMENTS

CN    103926474 A    7/2014
CN    104931799 A    9/2015
(Continued)

OTHER PUBLICATIONS

English translation of CN 115494312, Dec. 20, 2022. (Year: 2022).*
(Continued)

*Primary Examiner* — Michael P Nghiem
(74) *Attorney, Agent, or Firm* — Cheng-Ju Chiang (57) ABSTRACT

A near-field testing method proposed in the present invention includes steps of: in a selected coordinate system, controlling a mover to cause random relative movement of the DUT and the probe to generate multiple random test points, determining one or more postures of the probe, and obtaining the electromagnetic field coefficients of the probe corresponding the postures of the probe respectively; obtaining measured values of the electromagnetic field signals collected by the probes, and obtaining a set of measured values; according to the set of measured values, the electromagnetic field coefficients of the probe, and according to the Lorenz reciprocity theorem in electromagnetism, determining electromagnetic field coefficients of the DUT through convex optimization; obtaining, according to the electromagnetic field coefficients of the DUT, a far field pattern of the DUT or an electric field and/or a magnetic field at any point outside the DUT.

7 Claims, 4 Drawing Sheets

(58) Field of Classification Search
USPC .......................................................... 702/58
See application file for complete search history.

(56) References Cited

U.S. PATENT DOCUMENTS

| | | | |
|---|---|---|---|
| 2012/0081114 A1 | 4/2012 | Weller et al. | |
| 2012/0268153 A1* | 10/2012 | Nickel | G01R 31/3025 |
| | | | 324/754.31 |
| 2013/0002275 A1* | 1/2013 | Min | G01R 31/3191 |
| | | | 324/750.02 |
| 2014/0091813 A1* | 4/2014 | Hoang | G01R 27/32 |
| | | | 324/629 |
| 2014/0141726 A1* | 5/2014 | Schlub | G01R 29/0871 |
| | | | 455/67.12 |
| 2015/0048858 A1* | 2/2015 | Nickel | G01R 31/3025 |
| | | | 324/754.31 |
| 2019/0227003 A1* | 7/2019 | Ghasr | G07D 7/1205 |
| 2021/0085208 A1 | 3/2021 | Trzasko | |
| 2021/0266078 A1* | 8/2021 | Schmitz | G01R 29/08 |
| 2023/0029048 A1* | 1/2023 | Hahn, III | H04B 17/0085 |
| 2023/0198143 A1* | 6/2023 | Leather | H04B 17/23 |
| | | | 455/41.1 |

FOREIGN PATENT DOCUMENTS

| | | | |
|---|---|---|---|
| CN | 204705678 U | | 10/2015 |
| CN | 105866772 A | | 8/2016 |
| CN | 108932369 A | | 12/2018 |
| CN | 111239730 A | | 6/2020 |
| CN | 112526220 A | | 3/2021 |
| CN | 113139157 A | | 7/2021 |
| CN | 115494312 A | * | 12/2022 |
| EP | 3869223 A1 | | 8/2021 |

OTHER PUBLICATIONS

Foucart et al., A mathematical introduction to compressive sensing, 2013, Applied and Numerical Harmonic Analysis, Birkhauser. (Year: 2013).*

Definition of Formula, printed on Jul. 20, 2024. (Year: 2024).*

Zhangyou Chen, Zhenyu Sun, Penggen Xu; "Probe Compensation in Spherical Scanning in Near Field Technique", Journal of Wuhan University (Natural Science Edition), Jun. 1997, pp. 367-372, vol. 43, Issue No. 3, China Academic Journal Electronic Publishing House, China.

Zhenghui Xue, Benqing Gao, Ruixiang Liu, Shiming Yang, Chao Liu; "Investigation of Near-Field-Far-Field Transformation in Antenna's Planar Near-Field Measurements", Journal of Microwaves, Mar. 2001, pp. 14-21, vol. 17, Issue No. 1, China.

Naihong Mao, Xinde Ju; "Section 9.4.2 to 9.4.6", Antenna Measure Brochure, Aug. 31, 1987, pp. 231-250, China.

Simon Foucart, Holger Rauhut, "A Mathematical Introduction to Compressive Sensing", Applied and Numerical Harmonic Analysis, 2013, pp. 1-605, Birkhauser, Springer Science+Business Media, New York, U.S.A.

Stuart Gregson, John McCormick, Clive Parini, "Principles of Planar Near-Field Antenna Measurements", IET Electromagnetic Waves Series 53, 2007, pp. 1-397, The Institution of Engineering and Technology, London, United Kingdom.

A. A. Ahmadi, "Theory of Convex Functions" to "Optimality Conditions for Convex Optimization", Lecture 7, 2015, pp. 1-14, Princeton University.

Jian-Ming Jin, "Theory and Computation of Electromagnetic Fields", 2010, pp. 1-558, IEEE Press & John Wiley & Sons, Inc., Publication, Hoboken, New Jersey, U.S.A.

* cited by examiner

NEAR-FIELD TEST METHOD, SYSTEM, READABLE STORAGE MEDIUM AND COMPUTER

CROSS REFERENCE TO RELATED APPLICATIONS

The present invention is a 35 U.S.C. § 119 benefit of earlier filing date; right of priority of Chinese Application No. 202111161940.5, filed on Sep. 30, 2021, the disclosure of which is incorporated by reference herein.

BACKGROUND OF THE INVENTION

Field of the Invention

The present invention relates to the field of test, and more particularly, to a near-field test method, system, readable storage medium and computer.

Description of Related Art

The traditional near-field test methods include: planar near-field test method, cylindrical near-field test method and spherical near-field test method. These methods are based on discretion for the Lorenz reciprocity theorem in the physical equations in the planar coordinate system, the cylindrical coordinate system, and the spherical coordinate system, respectively, so that the variables to be determined (such as the plane wave coefficients, cylindrical wave coefficients or spherical wave coefficients of DUT (Device Under Test, object to be tested)) and the values collected by the probe have a Fourier transform relationship. The Fourier transform relationship makes the test points of the probe fixed grid points on the sampling plane, sampling cylinder or sampling sphere; and the interval of grid points satisfies Nyquist Sampling Theorem, that is, the interval of grid points is half wavelength. As the operating frequency of the DUT increases, the total number of points to be tested increases dramatically. For example, in a given square test area, the traditional planar near-field test method requires at least $(2/\lambda)^2$ test points in the square test area to calculate the far-field pattern of the DUT, where $\lambda$ represents the wavelength, which is inversely proportional to the operating frequency. Therefore, when the operating frequency of the DUT increases, the total number of points to be tested by the traditional near-field test method increases in proportion to the square of the operating frequency, and the test efficiency also decreases in proportion to the square of the operating frequency. This greatly limits the test efficiency in high-frequency scenarios (such as 5G, 6G DUT).

BRIEF SUMMARY OF THE INVENTION

An object of the present invention is to provide a near-field test method, system, readable storage medium and computer, which aims to solve the problems that when the operating frequency of the DUT increases, the total number of points to be tested by the traditional near-field test method increases in proportion to the square of the operating frequency, and the test efficiency also decreases in proportion to the square of the operating frequency, which greatly limits the test efficiency in high-frequency scenarios.

In a first aspect, the present invention provides a near-field test system, comprising: a computer and a source of signal for generating test signals, a signal receiver, a mover and at least one probe respectively connected to the computer; wherein the source of signal, signal receiver, probe and DUT form a closed loop for test signals;

the mover is used for accepting a control of the computer to cause a random relative motion between the DUT and the probe to generate multiple random test points;

when the probe is connected to the signal receiver, the source of signal is connected to the DUT; when the probe is connected to the source of signal, the signal receiver is connected to the DUT; the probe is used to collect the electromagnetic signals at multiple random test points and transmit the signals directly to the signal receiver or to the DUT and then the DUT to the signal receiver;

the signal receiver is used to analyze and process the electromagnetic signals collected by the probe and transmit to the computer; and the computer is used for: selecting any coordinate system, where electromagnetic field coefficients of the DUT to be determined present a sparse feature; in the selected coordinate system, controlling the mover to cause random relative motion between the DUT and the probe to generate multiple random test points to obtain one or more postures of the probe and electromagnetic field coefficients of the probe corresponding to the postures of the probe respectively; obtaining measured values of the electromagnetic field signals collected by the probe after being analyzed and processed by the signal receiver, and obtaining a measured value set; according to the measured value set and the electromagnetic field coefficients of the probe corresponding to the postures of the probe respectively, and according to the Lorenz reciprocity theorem in electromagnetism, determining electromagnetic field coefficients of the DUT through the convex optimization, and obtaining, according to the electromagnetic field coefficients of the DUT, a far-field pattern of the DUT or an electric field and/or a magnetic field at any point outside the DUT.

In a second aspect, the present invention provides a near-field test method, comprising steps of:

selecting any coordinate system, where electromagnetic field coefficients of the DUT to be determined present a sparse feature;

in the selected coordinate system, controlling a mover to cause a random relative motion between the DUT and the probe to generate multiple random test points to obtain one or more postures of the probe and electromagnetic field coefficients of the probe corresponding to the postures of the probe respectively;

obtaining measured values of the electromagnetic field signals collected by the probe and obtaining a measured value set;

according to the measured value set, the positions of random test points and the electromagnetic field coefficients of the probe corresponding to the postures of the probe respectively, and according to the Lorenz reciprocity theorem in electromagnetism, determining electromagnetic field coefficients of the DUT through the convex optimization; and obtaining, according to the electromagnetic field coefficients of the DUT, a far-field pattern of the DUT or an electric field and/or a magnetic field at any point outside the DUT.

In a third aspect, the present invention provides a non-transitory computer-readable storage medium configured to store one or more computer programs including instructions that, when executed by at least one processor, cause the at least one processor to perform the steps of the above-mentioned near-field test method.

In a fourth aspect, the present invention provides a computer, comprising:
one or more processors; a memory, and one or more computer-executable programs including instructions; the one or more processors and the memory are connected by bus; the one or more computer-executable programs are stored in the memory and are executable by the one or more processors to perform the steps of the above-mentioned near-field test method.

In the present invention, since a coordinate system is selected that makes the electromagnetic field coefficients of the DUT to be determined represent sparse feature, the obtained electromagnetic field coefficients of the DUTs show sparse feature, and multiple random test points are selected in this coordinate system, then, the value set has a random linear relationship with the electromagnetic field coefficients of the DUT to be determined. Therefore, the electromagnetic field coefficient of the DUT can be reduced to a convex optimization whose objective function is a convex function that the electromagnetic field coefficients of the DUT can be determined by an algorithm of convex optimization. And because the probe collects electromagnetic field signals at multiple random test points, when the DUT is a medium-high gain DUT, the method of the present invention can determine the DUT's far-field pattern and other information with much less test points than the traditional algorithm, which can greatly improve the test efficiency. Experiments show that only ⅕ of the sampling points in the traditional planar near-field can be used to restore the far-field pattern of the DUT.

DETAILED DESCRIPTION OF THE INVENTION

In order to make the object, technical solutions, and advantages of the present invention clearer, the present invention will be described in further detail below with reference to the accompanying drawings and embodiments. The embodiments described herein are only used to explain the present invention, but not to limit the present invention.

The following embodiments illustrate the technical solutions.

Figure 1:
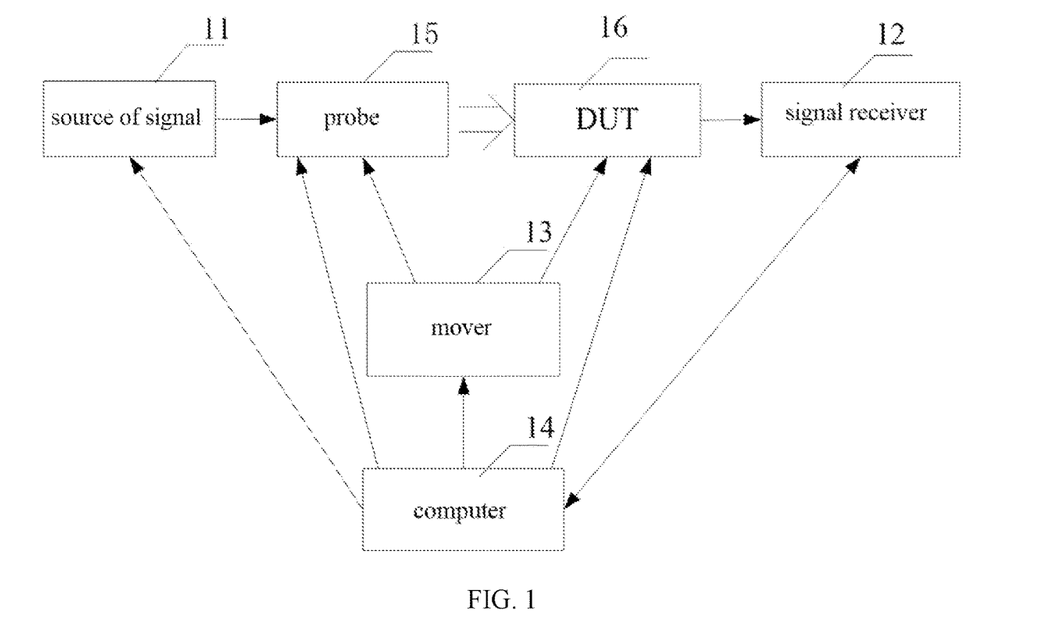
FIG. 1 is a schematic diagram of a near-field test system in accordance with a first embodiment of the present invention.
Figure 2:
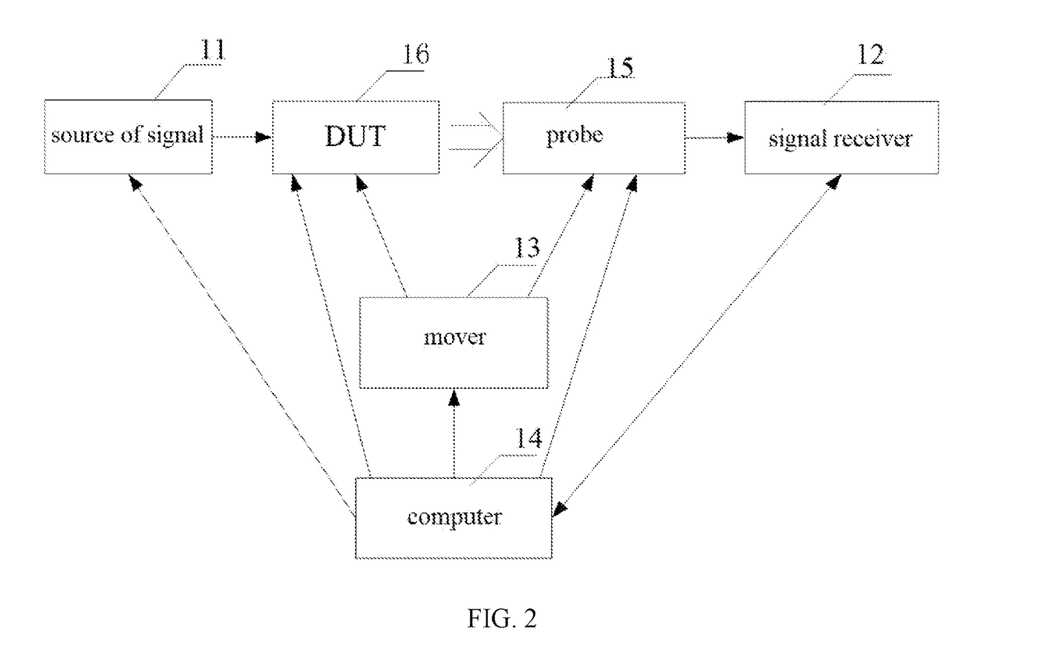
FIG. 2 is a second schematic diagram of the near-field test system in accordance with the embodiment of the present invention.

Referring to FIGS. 1 and 2, a near-field test system in accordance the embodiment of the present invention includes a computer 14 and a source of signal 11 for generating test signals, a signal receiver 12, a mover 13 and at least one probe 15 respectively connected to the computer 14, where the source of signal 11, the signal receiver 12, the probe 15 and the DUT 16 form a closed loop of the test signals.

The mover 13 is used for accepting a control of the computer 14 to cause random relative motion of the DUT 16 and the probe 15 to generate multiple random test points.

When the probe 15 is connected to the signal receiver 12, the source of signal 11 is connected to the DUT 16; when the probe 15 is connected to the source of signal 11, the signal receiver 12 is connected to the DUT 16, and the probe 15 is used to collect the electromagnetic field signals of multiple random test points, and directly transmit the signals to the signal receiver or to the DUT and then the DUT to the signal receiver.

The signal receiver 12 is used to analyze and process the measured values of the electromagnetic field signal collected by the probe and transmit to the computer; the method for analyzing and processing the measured values may specifically include RF signal denoising, sampling, amplitude solution, phase, etc.

The computer 14 is used to: select any coordinate system that the electromagnetic field coefficients of the DUT 16 to be determined presents a sparse feature; in the selected coordinate system, control the mover 13 to cause a random relative motion between the DUT 16 and the probe 15 to generate multiple random test points, determine one or more postures of the probe 15, and determine the electromagnetic field coefficients of the probe corresponding to the postures of the probe 15; obtain measured values of the electromagnetic field signals collected by the probe 15 after being analyzed and processed by the signal receiver, and obtain a measured value set; according to the measured value set and the electromagnetic field coefficients of the probe corresponding to the postures of the probes 15 respectively, and according to the Lorenz reciprocity theorem in electromagnetism, determine the electromagnetic field coefficients of the DUT through the convex optimization; and obtaining, according to the electromagnetic field coefficients of the DUT, a far-field pattern of the DUT or an electric field and/or a magnetic field at any point outside the DUT.

The computer 14 is connected with the source of signal 11, the signal receiver 12, the mover 13 and the at least one probe 15, and is mainly used for controlling the source of signal 11, the signal receiver 12, the mover 13 and the at least one probe 15, and for data transmission.

In an embodiment of the present invention, the measured values of the electromagnetic field signals may include one or any combination of frequency, amplitude, phase information, and the like.

Convex optimization is a special optimization algorithm in which the objective function is a convex function and the domain obtained by the constraints is a convex set.

In an embodiment of the present invention, the mover may be: connected to the DUT to control the movement of the DUT; or, connected to the probe to control the movement of the probe; or, connected to both the DUT and the probe to control the movement of the DUT and the probe.

In an embodiment of the present invention, the source of signal may be an independent external signal transmitter, or may be a signal transmitter built in a radio frequency device (for example, a DUT or a probe). The signal receiver can be an independent external signal receiving device, or it can be a signal receiving device built in a radio frequency device (such as a DUT or a probe). The DUT can be any wireless communication device, such as an antenna, radar, cell phone, or the like.

In an embodiment of the present invention, the source of signal and the signal receiver may be combined, or may be separate devices.

In an illustrative embodiment of the present invention, a closed loop of a test signal formed by a source of signal, a signal receiver, a probe, and a DUT, specifically is:

referring to in FIG. 1, a signal is emitted by the source of signal, detected by the probe, and then passed through the space, transmitted to the DUT, and then transmitted to the signal receiver by the DUT; or, referring to FIG. 2, the signal is emitted by the source of signal, then radiated by the DUT, then passed through the space, and finally detected by the probe, and then enters the signal receiver.

The computer can monitor the transmitted and received signal parameters, and use these parameters to invert the features of the DUT.

Figure 3:
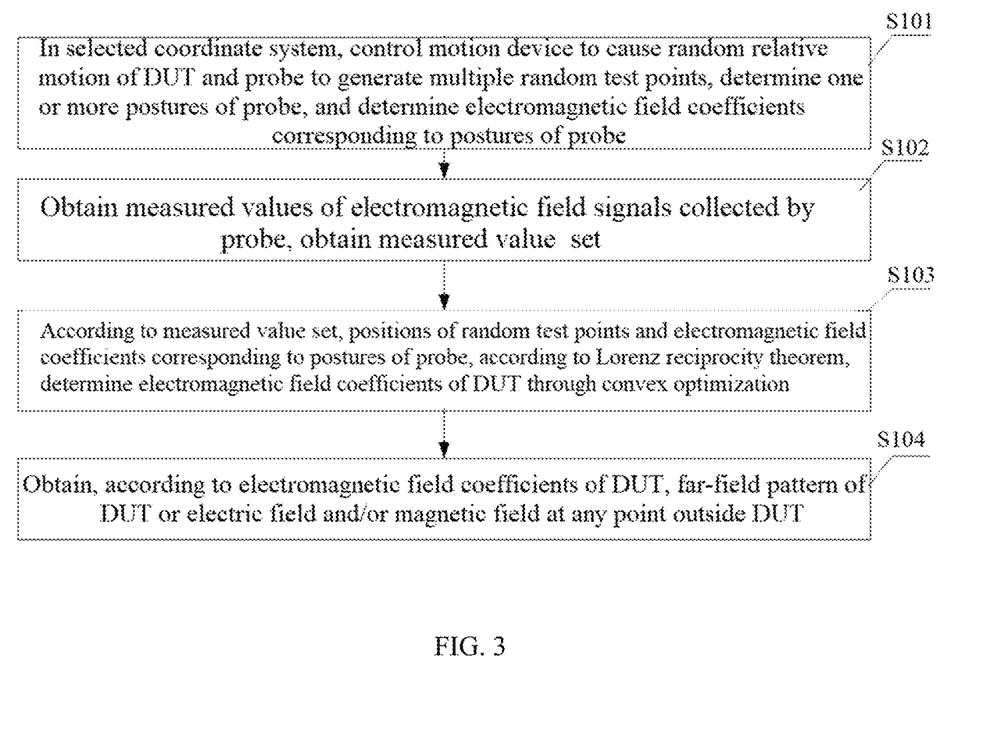
FIG. 3 is a flowchart of the near-field test method in accordance with the embodiment of the present invention.

Refer to FIG. 3, which is a flowchart of a near-field test method in accordance with an embodiment of the present invention. The near-field test method is applied to a computer as an example. The near-field test method comprising steps of S101 to S104 as below.

S101, selecting a coordinate system, where electromagnetic field coefficients of the DUT to be determined present a sparse feature in the selected coordinate system.

For example, if the electromagnetic field coefficients are plane wave coefficients, any orthogonal coordinate system rotated in three-dimensional space can be used as the coordinate system that can sparsely express the electromagnetic field coefficients.

At S101, in the selected coordinate system, controlling the mover to cause a random relative motion between the DUT and the probe to generate multiple random test points, and determining one or more postures of the probe to obtain electromagnetic field coefficients of the probe corresponding to the postures of the probe respectively.

In an embodiment of the present invention, S101 may specifically be:

in the selected coordinate system, defining randomly distributed test points, and randomly generating N test points $p_i$ in the space area $\Omega^c$ outside the DUT, where $1 \leq i \leq N$, N is a natural number greater than 1;

taking the probe center point as the origin, and determining K postures corresponding to the probe in the selected coordinate system, where K is a natural number greater than or equal to 1;

according to the specifications of the probe and the K postures of the probe, determining K electromagnetic field coefficients of the probe corresponding to the K postures of the probe respectively.

S102, obtain the measured values of the electromagnetic field signals collected by the probe to obtain a measured value set.

In an embodiment of the present invention, S102 may specifically be:

obtaining the measured values of the electromagnetic field signals collected by the probe to obtain the measured value set $\mathcal{M}$, $\mathcal{M} = \{m_i^{(j)}: 1 \leq i \leq N, 1 \leq j \leq K\}$, where $m_i^{(j)}$ represents the measured value collected by the probe to the DUT when the probe is at the j posture and at the test point $p_i$.

S103, according to the measured value set, the positions of the random test points, and the electromagnetic field coefficients of the probe corresponding to the postures of the probes respectively, and according to the Lorenz reciprocity theorem in electromagnetism, determining the electromagnetic field coefficients v of the DUT through convex optimization.

In an embodiment of the present invention, at S103, specifically:

a sparse feature of the electromagnetic field coefficients v of the DUT to be determined by a convex function which is represented by f(v), according to Lorenz reciprocity theorem, there is a random linear relationship $Av = \mathcal{M}$ between the electromagnetic field coefficients v of the DUT and the measured value set $\mathcal{M}$; the random linear relationship $Av = \mathcal{M}$ can be used as a constraint or a penalty function in the domain optimization; combine the convex function f(v) and the random linear relationship $Av = \mathcal{M}$ into the algorithm of convex optimization to obtain:

when $Av = \mathcal{M}$ is used as the constraint, the algorithm of convex optimization is written as Expression (1):

$$\text{Minimize } f(v) \text{ subject to } Av = \mathcal{M} \tag{1}$$

when $Av = \mathcal{M}$ is used as the penalty function, the algorithm of convex optimization is written as Expression (2):

$$\text{Minimize } f(v) + P(Av - \mathcal{M}) \tag{2}$$

where A is a random matrix, and elements of A are determined by the positions of the random test points and the electromagnetic field coefficients of the probe corresponding to the probe at each posture; P(.) is a convex function, which increases with the increase of the modulus of the vector $Av - \mathcal{M}$. As for convex functions f(v) or P(.), please referring to (but not limited to): literature [1]: by Simon Foucart, Holger Rauhut, *A mathematical introduction to compressive sensing*, Applied and Numerical Harmonic Analysis, Birkhauser (2013), Pages 5 and 18; literature [2]: by Stuart Gregson, John McCormick and Clive Parini, *Principles of Planar Near-Field Antenna Measurements*, Published by the Institution of Engineering and Technology, 2007, Page 99: ORF 523 Lecture 7 Spring 2015, Princeton University, Instructor: A. A. Ahmadi); and literature [3]: Jian-Ming Jin, *Theory and Computation of Electromagnetic Fields*, Published by John Wiley & Sons, Inc., 1962; definition and calculation methods of convex functions (for example, f(v) or P(.)) are well-known in the field, and will not be described in detail here. Therefore, Expressions (1) and (2) are both convex programming problems, which can be solved by the algorithm of convex optimization, specifically, Expression (1) can be solved by means of (but not limited to) Iteratively reweighted least squares according to page 493 of literature [1]; Expression (2) can be solved by means of (but not limited to) Primal-Dual Algorithm according to page 482 of literature [1], the calculation is well-known and will not be described in detail here. The variable v is calculated and determined as the electromagnetic field coefficients v of the DUT.

S104, obtaining a far-field pattern of the DUT or an electric field and/or a magnetic field at any point outside the DUT according to the electromagnetic field coefficients of the DUT.

Because when the type of the electromagnetic coefficient of the DUT is determined, the basis function corresponding to the electromagnetic coefficient of the DUT is determined. For example, when the electromagnetic coefficient of the DUT is a plane wave coefficient, then its basis function is a plane wave vector function. For example, when the electromagnetic coefficient of the DUT is a spherical wave coefficient, then its basis function is a spherical wave vector function.

According to the Lorenz reciprocity theorem in electromagnetism, the measured values of the DUT for the probe in a certain state can be expressed as the linear coupling of the electromagnetic field coefficient (that is, the variable to be determined) of the DUT and the electromagnetic field coefficient (known variable) of the probe in this state.

Figure 4:
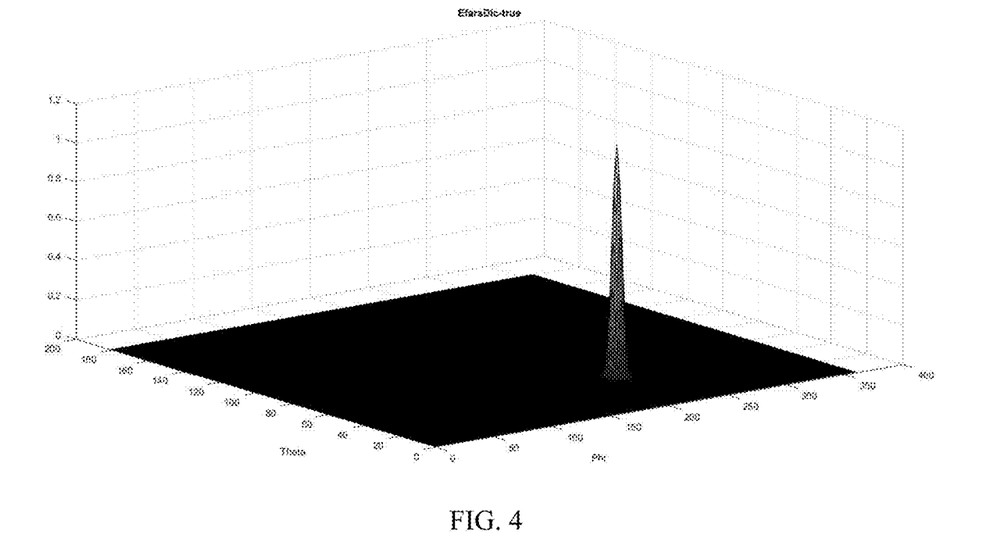
FIG. 4 is an amplitude plot of the true values of the far-field pattern of the DUT.
Figure 5:
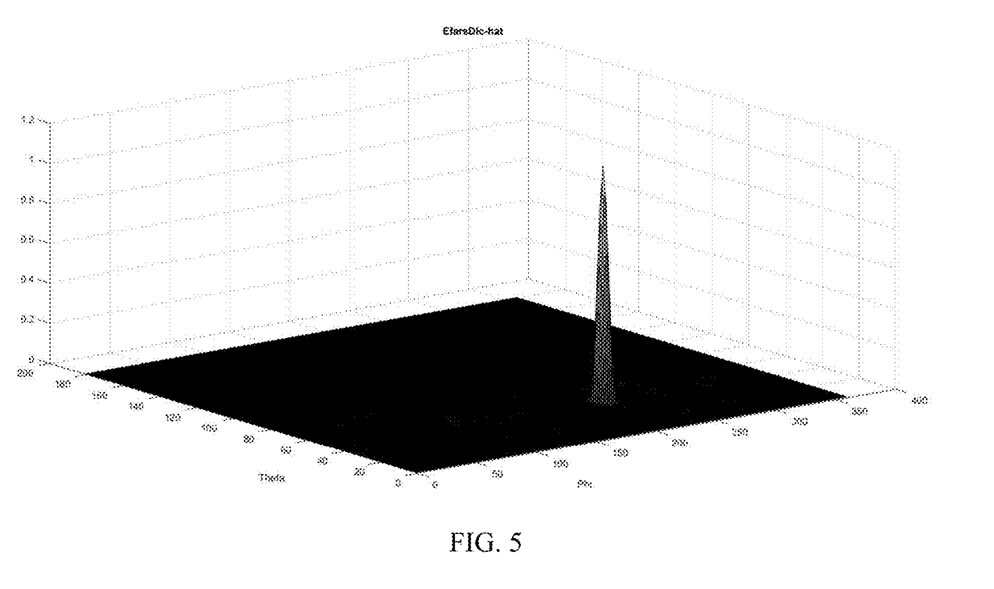
FIG. 5 is an amplitude plot of the estimated values of the far-field pattern of the DUT.
Figure 6:
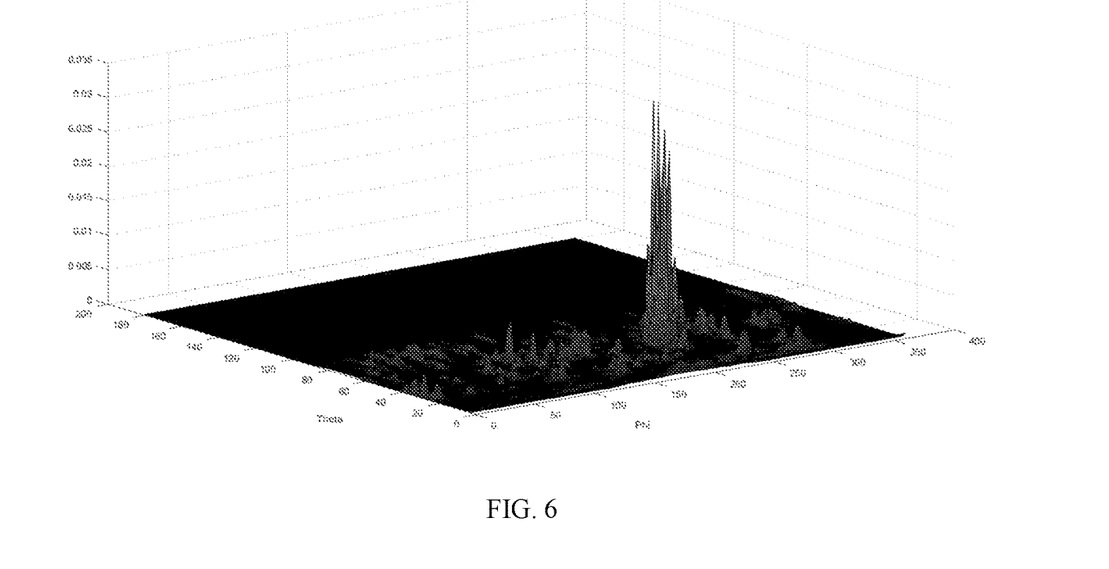
FIG. 6 is an amplitude plot of the difference between the estimated values and the true values of the far-field pattern of the DUT.

In the present invention, since a coordinate system is selected that makes the electromagnetic field coefficients of the DUT to be determined represent sparse feature, the obtained electromagnetic field coefficients of the DUTs show sparse feature, and multiple random test points are selected in this coordinate system, then, the value set has a random linear relationship with the electromagnetic field coefficients of the DUT to be determined. Therefore, the electromagnetic field coefficient of the DUT can be reduced to a convex optimization whose objective function is a convex function that the electromagnetic field coefficients of the DUT can be determined by an algorithm of convex optimization. And because the probe collects electromagnetic field signals at multiple random test points, when the DUT is a medium-high gain DUT, the method of the present invention can determine the DUT's far-field pattern and other information with much less test points than the traditional algorithm, which can greatly improve the test efficiency. Experiments show that only ⅕ of the sampling points in the traditional planar near-field can be used to restore the far-field pattern of the DUT. If the DUT is a high-gain antenna, the amplitude diagram of the real value of the far-field pattern is shown in FIG. 4. Theta axis and Phi axis represent the theta and phi angles (unit is degree) of the spherical coordinate system respectively, and the height represents the amplitude of the far field pattern vector. The amplitude plot of the estimated value of the far-field pattern of the DUT is shown in FIG. 5. FIG. 6 represents the amplitude plot of the difference between the estimated values of the far-field pattern and the real values of the far-field pattern, and the relative error recovered through the algorithm is less than 3%.

The present invention provides a non-transitory computer-readable storage medium, where the computer-readable storage medium stores one or more computer programs including instructions, and when the computer programs including instructions is executed by one or more processor, performs steps of the near-field test method of the above embodiment of the present invention.

Figure 7:
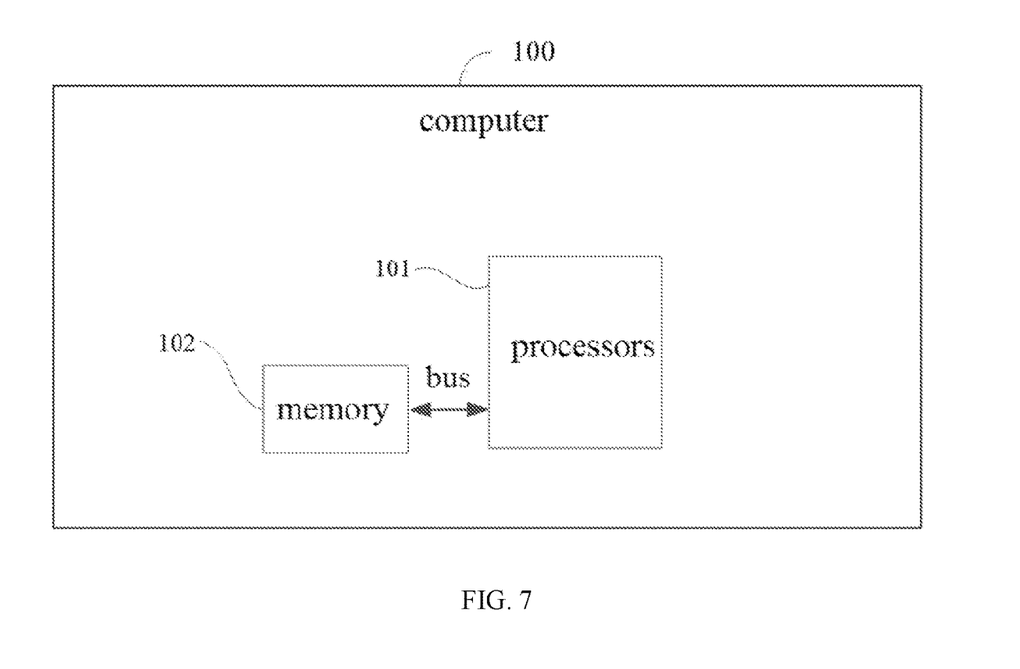
FIG. 7 is a block diagram of a computer in accordance with the embodiment of the present invention.

FIG. 7 shows a block diagram of a computer in accordance with an embodiment of the present invention. A computer 100 includes: one or more processors 101, a memory 102, and one or more computer programs including a set of computer-executable instructions, wherein the processors 101 and the memory 102 are connected by a bus; the one or more computer programs including a set of computer-executable instructions are stored in the memory 102 and configured to be executed by the one or more processors 101, and when are executed to cause the one or more processors 101 to perform the steps of the near-field test method of the above-mentioned embodiments of the present invention. The computer includes servers and terminals. The computer can be a desktop computer, a mobile terminal, or a vehicle-mounted device, etc. The mobile terminal can include at least one of a mobile phone, a tablet computer, a personal digital assistant, or a wearable device.

The steps in the embodiments of the present invention are not necessarily performed sequentially in the order indicated by the step numbers S101 to S104. Unless explicitly stated herein, the steps are not strictly limited to the order and may be performed in other orders. Moreover, at least some steps in each embodiment may include multiple sub-steps or multiple stages. These sub-steps or stages are not necessarily performed and completed at the same time, but may be performed at different times. The sub-steps or stages are also not necessarily sequential, but may be performed alternately or alternately with other steps or sub-steps.

Those of ordinary skill in the art can understand that all or part of the steps in the methods of the above embodiments can be executed by instructing relevant hardware through one or more computer programs including a set of computer-executable instructions, and the programs including a set of computer-executable instructions can be stored in a non-transitory computer-readable storage medium, when the program is executed, it may include the flow of the method of the above-mentioned embodiments. Wherein, any reference to memory, storage, database, or other medium used in the various embodiments provided in present invention may include non-volatile and/or volatile memory. Nonvolatile memory may include read only memory (ROM), programmable ROM (PROM), electrically programmable ROM (EPROM), electrically erasable programmable ROM (EEPROM), or flash memory. Volatile memory may include random access memory (RAM) or external cache memory. By way of illustration and not limitation, RAM is available in various forms such as static RAM (SRAM), dynamic RAM (DRAM), synchronous DRAM (SDRAM), double data rate SDRAM (DDRSDRAM), enhanced SDRAM (ESDRAM), synchronous chain Road (Synch link) DRAM (SLDRAM), memory bus (Rambus) direct RAM (RDRAM), direct memory bus dynamic RAM (DRDRAM), and memory bus dynamic RAM (RDRAM), etc.

The technical features of the above embodiments can be combined arbitrarily. In order to make the description simple, all possible combinations of the technical features in the above embodiments are not described. However, if there is no contradiction in the combination of these technical features It is the range described in this specification.

The above embodiments only represent several embodiments of the present invention, and the descriptions thereof are specific and detailed, but should not be construed as a limitation on the scope of the present invention. For those of ordinary skill in the art, without departing from the concept of the present invention, several modifications and improvements can also be made, which all belong to the protection scope of the present invention. Therefore, the protection scope of the present invention should be subject to the appended claims.

What is claimed is:

1. A near-field test system, comprising:
   a computer; and;
   a source of signal for generating test signals, a signal receiver, a mover and at least one probe respectively connected to the computer;
   wherein the source of signal, the signal receiver, the probe and a device under test (DUT) form a closed loop;
   the mover is used for accepting a control of the computer to cause a random relative motion between the DUT and the probe to generate multiple random test points;
   when the probe is connected to the signal receiver, the source of signal is connected to the DUT; when the probe is connected to the source of signal, the signal receiver is connected to the DUT; the probe is used to collect electromagnetic field signals at the multiple random test points and transmit the electromagnetic field signals directly to the signal receiver or to the DUT and then the DUT to the signal receiver;

the signal receiver is used to analyze and process the electromagnetic field signals collected by the probe and transmit to the computer; and the computer is used for:

in a selected coordinate system, controlling the mover to cause the random relative motion between the DUT and the probe to generate the multiple random test points that satisfy the near field;

determining one or more postures of the probe to obtain electromagnetic field coefficients of the probe corresponding to the postures of the probe respectively;

obtaining measured values of the electromagnetic field signals collected by the at least one probe after being analyzed and processed by the signal receiver so as to obtain a measured value set $\mathcal{M}$, $\mathcal{M} = \{m_i^{(j)}: 1 \leq i \leq N, 1 \leq j \leq K\}$, where $m_i^{(j)}$ represents the measured values of the electromagnetic field signals when the probe is at a j posture and at the test point $p_i$;

calculating electromagnetic field coefficients v of the DUT: wherein a sparse feature of the electromagnetic field coefficients v of the DUT to be determined is a convex function which is represented by f(v); according to Lorenz reciprocity theorem, there is a random linear relationship $Av = \mathcal{M}$ between the electromagnetic field coefficients v of the DUT and the measured value set $\mathcal{M}$, the random linear relationship $Av = \mathcal{M}$ is used as a constraint or a penalty function in a domain optimization, combining the convex function f(v) and the random linear relationship $Av = \mathcal{M}$ into an algorithm of convex optimization;

when $Av = \mathcal{M}$ is used as the constraint, the algorithm of convex optimization is written as Expression (1):

Minimize $f(v)$ subject to $Av = \mathcal{M}$      Expression (1)

when $Av = \mathcal{M}$ is used as the penalty function, the algorithm of convex optimization is written as Expression (2):

Minimize $f(v) + P(Av - \mathcal{M})$      Expression (2)

where A is a random matrix, and elements of A are determined by positions of the random test points and the electromagnetic field coefficients of the probe at each posture; P(.) is a convex function, which increases with an increase of modulus of the vector $Av - \mathcal{M}$, Expressions (1) and (2) are solved by the algorithm of convex optimization, and a variable v is calculated and is determined as the electromagnetic field coefficients v of the DUT; and obtaining, according to the electromagnetic field coefficients v of the DUT, a far-field pattern of the DUT or an electric field and/or a magnetic field at any point outside the DUT.

2. The system as claimed in claim 1, wherein the mover is: connected to the DUT to control the DUT moving; or, connected to the probe to control the probe moving; or, connected to the DUT and the probe to control the DUT and the probe moving.

3. The system as claimed in claim 1, wherein the source of signal is an independent external signal transmitter, or, is a signal transmitter built in a radio frequency device; the signal receiver is an independent external signal receiving device, or is a signal receiving device built in a radio frequency device; or, the source of signal and the signal receiver are combined.

4. A near-field test method, comprising steps of:

S101, in a selected coordinate system, controlling a mover to cause a random relative motion between a device under test (DUT) and at least one probe to generate multiple random test points that satisfy the near field so as to determine one or more postures of the probe and electromagnetic field coefficients of the probe corresponding to the postures of the probe respectively;

S102, obtaining measured values of electromagnetic field signals collected by the at least one probe so as to obtain a measured value set $\mathcal{M}$, $\mathcal{M} = \{m_i^{(j)}: 1 \leq i \leq N, 1 \leq j \leq K\}$, where $m_i^{(j)}$ represents the measured values of the electromagnetic field signals when the probe is at a j posture and at the test point $p_i$;

S103, calculating electromagnetic field coefficients v of the DUT: wherein a sparse feature of the electromagnetic field coefficients v of the DUT to be determined is a convex function which is represented by f(v); according to Lorenz reciprocity theorem, there is a random linear relationship $Av = \mathcal{M}$ between the electromagnetic field coefficients v of the DUT and the measured value set $\mathcal{M}$, the random linear relationship $Av = \mathcal{M}$ is used as a constraint or a penalty function in a domain optimization; combining the convex function f(v) and the random linear relationship $Av = \mathcal{M}$ into an algorithm of convex optimization;

when $Av = \mathcal{M}$ is used as the constraint, the algorithm of convex optimization is written as Expression (1):

Minimize $f(v)$ subject to $Av = \mathcal{M}$      Expression (1)

when $Av = \mathcal{M}$ is used as the penalty function, the algorithm of convex optimization is written as Expression (2):

Minimize $f(v) + P(Av - \mathcal{M})$      Expression (2)

where A is a random matrix, and elements of A are determined by positions of the random test points and the electromagnetic field coefficients of the probe at each posture; P(.) is a convex function, which increases with an increase of modulus of the vector $Av - \mathcal{M}$, Expressions (1) and (2) are solved by the algorithm of convex optimization, and a variable v is calculated and is determined as the electromagnetic field coefficients of the DUT; and S104, obtaining, according to the electromagnetic field coefficients v of the DUT, a far-field pattern of the DUT or an electric field and/or a magnetic field at any point outside the DUT.

5. The method as claimed in claim 4, wherein the step of S101 specifically is:

in the selected coordinate system, defining randomly distributed test points, and randomly generating N test points $p_i$ in a space area $\Omega^c$ outside the DUT, where $1 \leq i \leq N$, N is a natural number greater than 1;

taking a probe center point as the origin, and determining K postures of the probe in the selected coordinate system, where K is a natural number greater than or equal to 1; and determining, according to the specifications of the probe and the K postures of the probe, K electromagnetic field coefficients of the probe corresponding to the K postures of the probe respectively.

6. A non-transitory computer-readable storage medium having one or more computer programs, when executed by at least one processor, cause the at least one processor to perform the steps of the near-field test method as claimed in claim 4.

7. A computer comprising:
one or more processors;
a memory; and
one or more computer programs; wherein the processors and the memory are connected by a bus; the one or more computer programs are stored on the memory and configured to be executed by the one or more processors, when the processors execute the computer programs, perform a near-field test method, comprising steps of:
S101, in a selected coordinate system, controlling a mover to cause a random relative motion between a device under test (DUT) and at least one probe to generate multiple random test points that satisfy the near field so as to determine one or more postures of the probe and electromagnetic field coefficients of the probe corresponding to the postures of the probe respectively;
S102, obtaining measured values of electromagnetic field signals collected by the at least one probe so as to obtain a measured value set $\mathcal{M}$, $\mathcal{M} = \{m_i^{(j)}: 1 \leq i \leq N, 1 \leq j \leq K\}$, where $m_i^{(j)}$ represents the measured values of the electromagnetic field signals when the probe is at a j posture and at the test point $p_i$;
S103, calculating electromagnetic field coefficients v of the DUT: wherein a sparse feature of the electromagnetic field coefficients v of the DUT to be determined is a convex function which is represented by f(v); according to Lorenz reciprocity theorem, there is a random linear relationship $Av = \mathcal{M}$ between the electromagnetic field coefficients v of the DUT and the measured value set $\mathcal{M}$, which is used as a constraint or a penalty function in a domain optimization, the convex function f(v) and the random linear relationship $Av = \mathcal{M}$ are combined into an algorithm of convex optimization, where A is a random matrix, and elements of A are determined by positions of the random test points and the electromagnetic field coefficients of the probe at each posture;

when $Av = \mathcal{M}$ is used as the constraint, the algorithm of convex optimization is written as Expression (1):

$$\text{Minimize } f(v) \text{ subject to } Av = \mathcal{M} \qquad \text{Expression (1)}$$

when $Av = \mathcal{M}$ is used as the penalty function, the algorithm of convex optimization is written as Expression (2):

$$\text{Minimize } f(v) + P(Av - \mathcal{M}) \qquad \text{Expression (2)}$$

where P(.) is a convex function, which increases with an increase of modulus of the vector $Av - \mathcal{M}$, Expressions (1) and (2) are solved by the algorithm of convex optimization, and a variable v is calculated and is determined as the electromagnetic field coefficients v of the DUT; and S104, obtaining, according to the electromagnetic field coefficients v of the DUT, a far-field pattern of the DUT or an electric field and/or a magnetic field at any point outside the DUT.

* * * * *